United States Patent [19]

Fu

[11] Patent Number: 5,205,132

[45] Date of Patent: Apr. 27, 1993

[54] COMPUTER-IMPLEMENTED METHOD AND SYSTEM FOR PRECISE TEMPERATURE CONTROL OF A DEVICE UNDER TEST

[75] Inventor: Deng-Yuan Fu, Sunnyvale, Calif.

[73] Assignee: Thermonics Incorporated, Santa Clara, Calif.

[21] Appl. No.: 898,073

[22] Filed: Jun. 12, 1992

[51] Int. Cl.⁵ .............................................. F25B 41/00
[52] U.S. Cl. .................................. 62/208; 236/15 BB; 236/78 B
[58] Field of Search ................. 236/78 B, 78 D, 91 F, 236/1 F, 15 BB; 62/208

[56] References Cited

U.S. PATENT DOCUMENTS

| | | | |
|---|---|---|---|
| 3,625,421 | 12/1971 | Garrison | 236/15 BB X |
| 4,734,872 | 3/1988 | Eager et al. | 364/557 |
| 4,925,089 | 5/1990 | Chapardo et al. | 236/15 BB X |
| 5,123,477 | 6/1992 | Tyler | 165/2 |

Primary Examiner—William E. Wayner
Attorney, Agent, or Firm—Thomas E. Schatzel

[57] ABSTRACT

An embodiment of the present invention is a temperature forcing system and method for precision temperature control of a device-under-test. The system comprises a thermal test head suspended by a support arm that receives a temperature controlled air flow through an output hose from an air supply system. A pair of temperature sensors, one attached to the device-under-test and the other in the output hose, are used differentially by a closed-loop temperature controller when the temperature of the device-under-test comes within a temperature window surrounding a target temperature setpoint point. Outside the temperature window control is linear and within the temperature window control is compensated by a correction factor obtained during a single calibration test that amalgamates the effects of the mass of the device-under-test, the ambient conditions and other factors.

9 Claims, 4 Drawing Sheets

COMPUTER-IMPLEMENTED METHOD AND SYSTEM FOR PRECISE TEMPERATURE CONTROL OF A DEVICE UNDER TEST

BACKGROUND OF THE INVENTION

1. Field of the Invention

The present invention relates generally to test equipment as used in manufacturing semiconductor and electronic devices, and more specifically to precision temperature forcing systems.

2. Description of the Prior Art

Localized temperature control of electronic components is widely used for military specification qualification, production testing, reliability testing, characterization, environmental stress screening and design verification.

The TP04000 series THERMOSTREAM test system from Temptronic Corporation (Newton, MA) is advertised to be capable of being used for testing components, hybrids, modules, small assemblies and printed circuit boards at temperatures from $-75°$ C. to $+225°$ C. The system includes an integral CRT screen for user interface and a mechanical locking arm that pipes hot and/or cold air at eighteen standard cubic feet per minute (SCFM) to a device-under-test (DUT). Temperature sensing of the airstream is done at the TP04000 system output nozzle, reportedly within one centimeter of the DUT. The manufacturer reports that this assures that the air affecting the DUT is within one degree Centigrade of the displayed temperature. The temperature accuracy and stability for all device types, package styles and power levels is provided by an automated electronic calibration routine. Custom temperature profiling routines including adjustable ramp rate, soak time and cycle sequences with up to twelve temperatures can be created with user menus presented on the CRT screen. Setup files and thermal profile routines can be developed, filed and retrieved from 3.5 inch floppy disks. Four to ten test set parameters can be loaded into main memory (RAM). A DUT control mode provides direct control of the DUT case temperature. A temperature sensor, e.g., a "K" type or "T" type thermocouple, is located on the test socket in contact with the DUT or attached to the device case to sense DUT temperature. A DUT control mode maintains a stable temperature. A change in the power dissipation level of the DUT is compensated for through air temperature control. The operator must manually fine tune the control constants to match the mass of the DUT for the best compromise between minimal overshoot and fastest temperature transition time.

FTS Systems (Stone Ridge, NY) markets a TURBO-JET system for precision temperature cycling from $-80°$ C. to $+230°$ C., using mechanically-refrigerated air at flow rates from five to fifteen SCFM. A microprocessor controller allows program transition rates from $0.1°$ C./minute to a maximum of $1600°$ C./minute. Eight separate programs with up to eight segments per program can be stored, including ramp rate, setpoint and soak time. A keypad is used to enter test temperature setpoints and tolerances, calibration values, ramp rates, soak time, air flow rate and device temperature exposure extremes. Test accuracy and repeatability are stated to be $\pm 1.0°$ C., with component stability maintained to $\pm 0.1°$ C. The temperature can also be controlled from the DUT. Ice can build up in the heat exchanger of a refrigeration system operating at $-80°$ C. so the TURBO-JET system uses an integrated drying system comprising a refrigerated air dryer, a water filter, an oil filter, a particle filter and a heatless regenerative air dryer to lower the dew-point temperature of incoming air to below $-80°$ C.

Thus there is a need for a system that automatically determines the best compromise between minimal overshoot and fastest temperature transition time.

SUMMARY OF THE PRESENT INVENTION

It is therefore an object of the present invention to provide a system and method for eliminating temperature overshoot in a temperature forcing test setup.

Briefly, an embodiment of the present invention includes a temperature forcing system and method for precision temperature control of a device-under-test. The system comprises a thermal test head suspended by a support arm that receives a temperature controlled air flow through an output hose from an air supply system. A pair of temperature sensors, one attached to the device-under-test and the other in the output hose, are used differentially by a closed-loop temperature controller when the temperature of the device-under-test comes within a temperature window surrounding a target temperature setpoint point. Outside the temperature window control is linear and within the temperature window control is compensated by a correction factor obtained during a single calibration test that combines the effects of the mass of the device-under-test, the ambient conditions and other factors.

An advantage of the present invention is that it provides a precision temperature cycling system and method that is superior to other methods such as slow moving ambient air or conduction of temperatures through hot or cold surfaces.

Another advantage of the present invention is that it provides a system and method for bringing devices to specific temperatures substantially without overshoot and reaches the desired temperature as quickly as other methods such as conventional single-loop or dual-loop temperature control.

Another advantage of the present invention is that it provides a system and method that quickly submerges a device in a stream of air of a specific temperature and accurately forces the device to the desired temperature.

Another advantage of the present invention is that it provides a system and method that can be used for testing devices or modules directly at the tester socket.

A further advantage of the present invention is that a system and method are provided for directly testing semiconductor components at temperature extremes while they are on an auto-tester performance board thereby permitting measurement of all electrical parameters (AC or dynamic and DC) without adding the long test leads that are common for a conventional oven. This further permits engineering evaluation or characterization of components, incoming inspection, production testing of small lots, quality assurance testing and failure analysis, and testing printed circuit boards, wafers, or modules at temperature.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
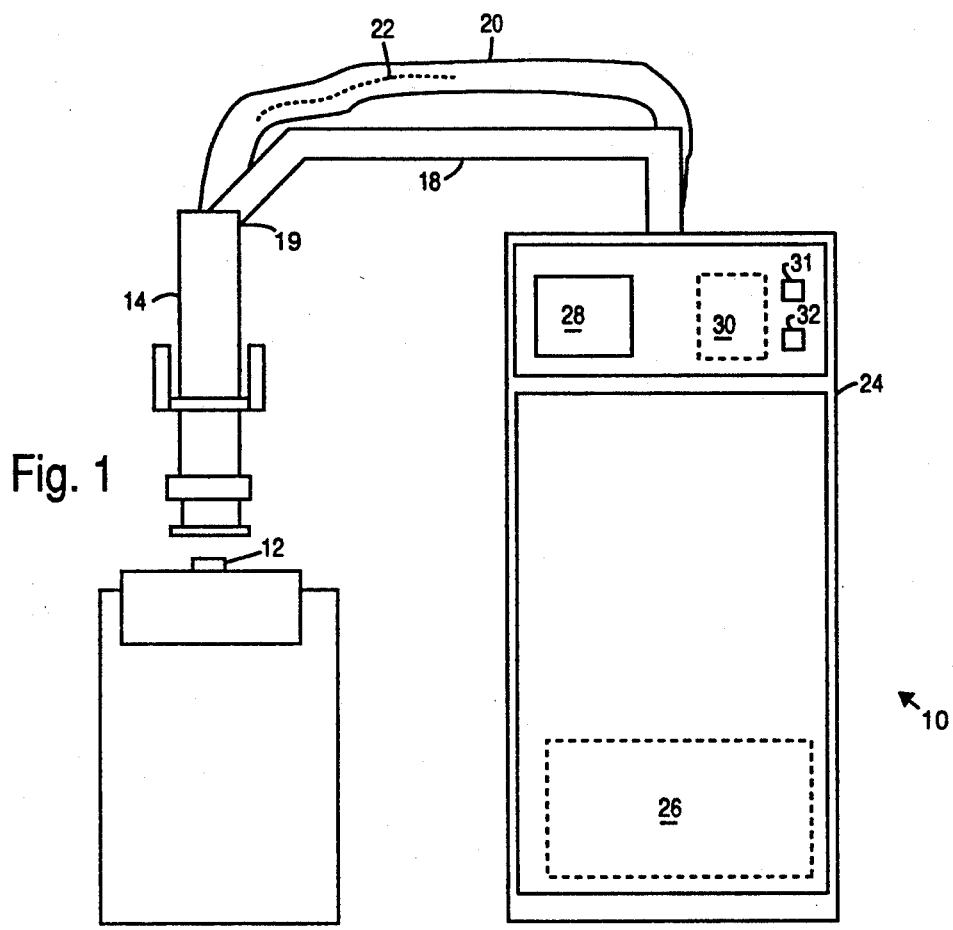
FIG. 1 is a front view of a temperature forcing system of the present invention positioned with its thermal test head over a device-under-test.

FIG. 1 illustrates an embodiment of the present invention in the form of a temperature forcing system, referred to by the general reference numeral 10, for heating or cooling a device-under-test (DUT) 12. A thermal test head 14 is suspended by a support arm 18 and lowered over DUT 12. Thermal test head 14 is connected to support arm 18 by a ball and socket joint 19 to allow freedom of rotation of thermal test head 14. A plastic, pleated conduit 20 contains an insulated air output hose 22 and wires to interconnect thermal test head 14 to a console 24 of test instruments. An air system 26 within the console 24 produces a stream of temperature controlled air that is ducted to DUT 12 via insulated output hose 22. The air stream keeps DUT 12 at a desired temperature by thermally insulating it from the surrounding ambient environment and can force DUT 12 to predetermined temperature setpoints. A user can control the operation of system 10 with a touch screen display 28 that is coupled to a control unit 30. Air system 26 is managed by control unit 30 which preferably comprises an Intel Corporation (Santa Clara, CA) 80386-based microcomputer system. Air flow preferably ranges from 200 to 900 SCFH, which is 1.6 to 7.6 liters per second, and is under software control of the microcomputer. Air temperature ranges from $-85°$ C. to $+230°$ C. to a setpoint accuracy of $\pm 1.0°$ C. that is stable to $\pm 0.3°$ C.

The front panel of console 24 includes a power switch 31, an emergency stop 32 and touch-screen CRT 28. The power switch 31 turns the system 10 power on or off. The emergency stop 32, is used to quickly discontinue power to all peripheral devices, while allowing system 10 to maintain important running data. Touch screen 28 provides access to the end-user software via a graphical user interface (GUI) for controlling all aspects of system 10 such as operating parameters. Touch screen 28 includes a thin film that is attached to a glass plate positioned over a cathode ray tube (CRT). A user touch position on screen is translated into an electrical signal that control unit 30 translates to a physical coordinate and can transmit to a CPU via an RS-232C interface. The touch locations map to specific areas of the GUI and enable interaction of the user with system 10.

Figure 2:
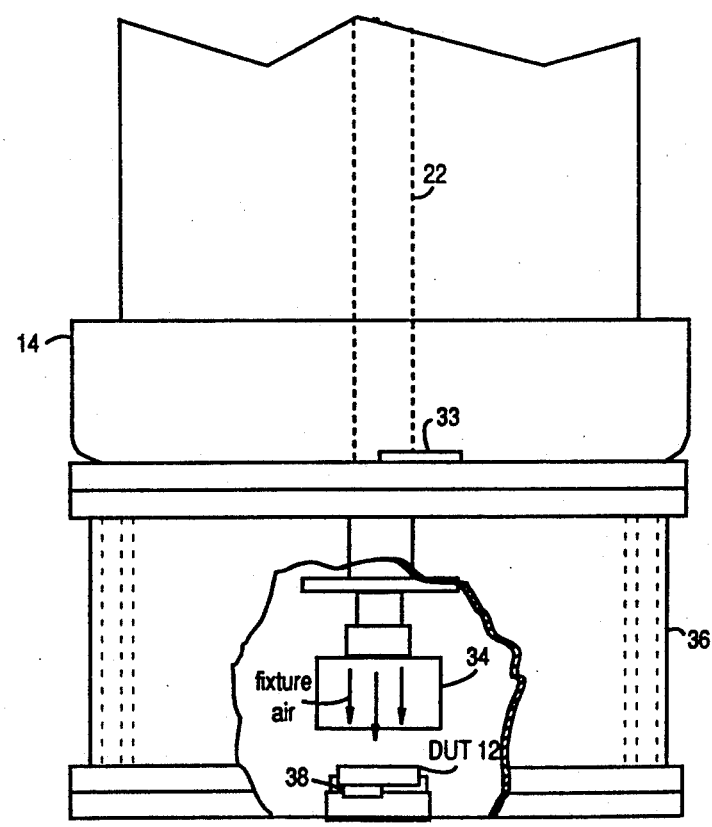
FIG. 2 is a cut-away front view of the thermal test head of the system of FIG. 1.

FIG. 2 shows thermal test head 14, including a temperature sensor 33, a silicon rubber thermal cap 34 and a glass shroud 36. Thermal cap 34 seals over DUT 12 during normal operation and receives the temperature controlled air stream from output hose 22. Temperature sensor 33 is positioned to sense the temperature of the air stream within output hose 22. A second temperature sensor 38 is attached to the bottom of DUT 12. The outputs of both sensors 33 and 38 are communicated back to control unit 30 via wires within conduit 20 and ultimately control air system 26 in a closed servo temperature control.

Figure 3:
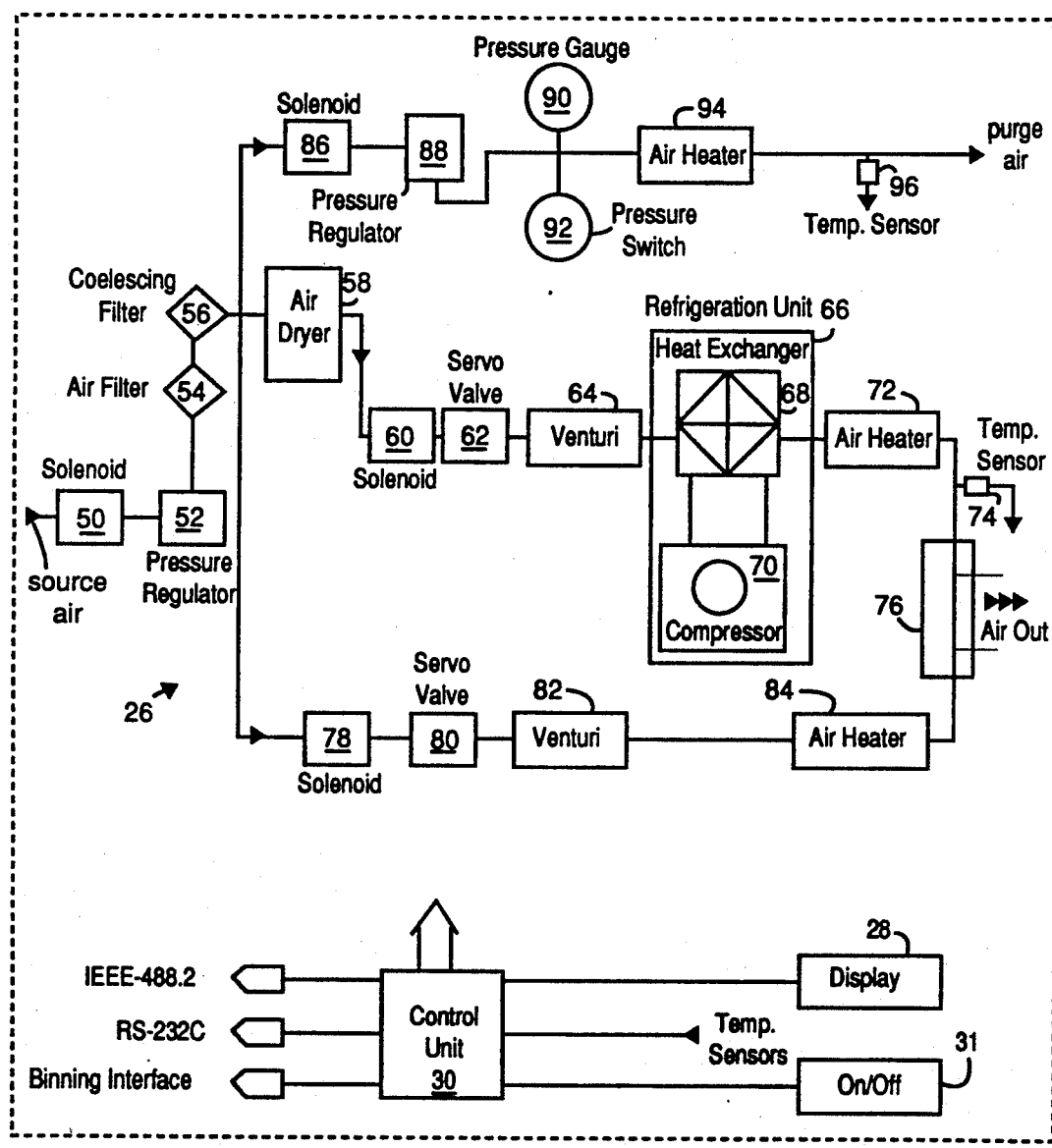
FIG. 3 is a schematic diagram of the air supply and control sub-systems of the system of FIG. 1.

FIG. 3 schematically illustrates that air system 26 comprises a solenoid 50 that admits source air (e.g., from an external source of compressed air), a pressure regulator 52, an air filter 54, a coalescing filter 56, and an air dryer 58. These remove moisture, oil and foreign particles from the source air. The moisture removal permits the air to be chilled in latter stages to a relatively low temperature without the development of frost or moisture that would otherwise inhibit air flow. A bypass may be used if the air supplied to air system 26 is dry air. Air dryer 58 comprises filters that purify the air, valves for directing air flow, and desiccant-filled tanks for drying the air. The end-product is air that is suitable for use in temperature-testing electronic components. The source air is under pressure of 80-110 PSIG, a flow rate of eighteen SCFM (8.6 liter/sec) and has a dew point of $+10°$ C. or lower at eighty PSIG.

Air system 26 further includes a cold flow pathway a solenoid 60, a servo valve 62, a venturi 64, a refrigeration unit 66 comprising a heat exchanger 68 and a compressor 70, and an air heater 72. Solenoid 60 provides an on-off control and servo valve 62 varies the volume of air flowing through refrigeration unit 66. Air heater 72, in combination with a temperature sensor 74 provides for adjustment of the temperature of refrigerated air flowing to an air output 76. A hot flow pathway comprises a solenoid 78, a servo valve 80, a venturi 82 and an air heater 84. Heated air from the second branch circuit or chilled air from the first branch circuit is directed to output hose 22 by air output 76. A third flow pathway provides heated purge air and comprises a solenoid 86, a pressure regulator 88, a pressure gauge 90, a pressure switch 92, an air heater 94 and a temperature sensor 96. Purge air is used to prevent test equipment used in conjunction with thermal test head 14 from overheating when forcing hot air on DUT 12, or from freezing and icing up when cold air is forced. For cold air, the purge air is typically heated to $+80°$ C. It is blown onto the interface between thermal test head 14 and the test equipment to prevent the formation of ice. When using hot air, the purge air is at ambient temperature. Control unit 30 receives signals from sensors 74 and 96 and are input to control unit 30 via an analog to digital converter (ADC). Control unit 30 controls solenoids 50, 60, 78 and 86; refrigeration unit 66; servo valves 62 and 80; and heaters 72, 84 and 94. Air heaters 72, 84 and 94 are in-line resistive-type air heaters, and may be located within the thermal test head 14. Venturis 64 and 82 are used to measure air flow rates in their respective pathways and are input to control unit 30 with the ADC.

Temperature-controlled purge air is used to prevent any frost and moisture from building up on thermal test head 14 and nearby test components. Two purging techniques may be used, one forces purge air outward through a series of vents located on the outside circumference of a base for thermal test head 14 and the other forces purge air outward through vents on a lid for thermal test head 14. The purge air can be specified by a user via touch screen 28.

Air filter 54 comprises a die-cast body, a metal bowl and other components, and spins source air using centrifugal force to remove most of the water content in the air. The bowl collects contaminants and has a glass window that allows for visual inspection. Coalescing filter 56 removes oil and dust particles, and comprises a die-cast body and a metal bowl. Coalescing elements are used to collect very small particles that will eventually accumulate in a sump. Filters 54 and 56 typically have manual drains.

In an alternative arrangement to that shown in FIG. 3, after source air is purified of particles and most of the water, it may be passed through a four-way solenoid-operated valve. A timing circuit is used to send a signal to the valve at one minute intervals. Upon reception of the signal, the four-way solenoid-operated valve adjusts the position of an inner shuttle using two opposed solenoids, to alternate the flow of air between a pair of desiccant-filled tanks. The tanks are coaxial-design and contain two kinds of desiccant, alumina and molecular sieve. Because the desiccants have a high affinity for water, the air that emerges is very dry and thus has a very low dew point ($-80°$ C). A spring-loaded diaphragm is used to maintain the desiccant at proper density by applying continuous pressure. While one tank is drying the air, the other may be back-flushed with dry air, thus ensuring that a continuous source of dry desiccant is available. Air passes out of the active tank, through a pilot-shuttle valve, and into the refrigeration pathway. A sample of the air flows through an air-flow restricting valve and is used to back-flush the non-active tank. When the tanks switch, a three-way spring return valve located near a muffler, momentarily engages to maintain pressure during the switch.

The refrigeration unit 66 cools the flow of compressed source air (typically at 80 PSIG and 25° C.) down to $-85°$ C. The cooling process includes a self-refrigerating cascade system that uses a single-stage compressor. A mixture of environmentally-safe and non-flammable refrigerants are compressed and circulated in a multi-step cycle. The cycle consists of compressing a working fluid mixture of refrigeration gasses (e.g., FREON); partially condensing the higher boiling fractions in the air-cooled condenser; withdrawing and throttling the condensate to produce cooling condensation of the remaining vapors in the heat exchanger; throttling and evaporating the condensate in a coil to produce cooling to very low temperatures; and returning of the refrigerant through the condenser to the compressor.

Touch screen display 28 preferably keeps the operator constantly informed of the status of system 10. Menus, messages, temperature information, and operating parameters are all displayed on touch screen display 28 during operation. Numeric values are entered into system 10 via a keypad graphic that appears on touch screen display 28, and alphabetic characters are entered via a keyboard graphic.

Various configurations of temperature sensors can be used to monitor the temperature of DUT 12. For example, "T" or "K" type thermocouple sensors may be used. Thermocouples can be used for the temperature sensing of the fixture air within output hose 22, DUT 12, and of the purge air, within one degree Centigrade. Thermocouples are temperature registering devices that are made up of dissimilar metals joined at each end. One junction is placed in the air stream where the temperature is to be measured, and the other on the DUT 12 A voltage (emf1) is generated that is linearly proportional to difference in temperature of the junctions. System software executing within control unit 30 uses this information to input the temperature for use in system control. System 10 may use two types of thermocouples for sensors 33 and 38, type "T" and type "K", as shown in Table I.

TABLE I

| Type | Temp. Range | EMF (mV) |
|------|-------------|----------|
| T | $-200°$ C. to $+350°$ C. | $-5.602$ to $+17.816$ |
| K | $-200°$ C. to $+1250°$ C. | $-5.973$ to $+50.633$ |

Circuitry to eliminate the noise generated by high-frequency environments is needed to avoid unstable or drifting temperatures. Uncontrolled noise can make temperature control and accuracy difficult, particularly in modes depending on a sense of DUT 12. When a thermocouple is grounded or connected to a conductive surface, such as device packaged in a metal enclosure, the noise problem can be acute. The signal from the thermocouples is enhanced by isolating the common mode noise from the differential signal, and rejecting the noise via a charge capacitor switch. Low-pass filtering techniques are used to enhance the desired frequency response characteristics of the thermocouple signals with a low-noise precision operational amplifier. In addition, the differential thermocouple input is altered into single-ended output.

The thermal time constant of DUT 12 is a measure of the time it takes for DUT 12 to approach the temperature of its environment. When DUT 12 is placed in a thermal environment, such as thermal test head 14, the temperature of DUT 12 will exponentially approach the temperature of the environment, which is, in this case, the temperature of the air within the thermal enclosure. As the temperatures converge, the rate of change decreases. Many factors contribute to the amount of time that is required for DUT 12 to reach and stabilize at a given temperature. Several factors will combine to affect the shape and character of a temperature change response curve that may be plotted. These factors include the type of material comprising DUT 12, the size of DUT 12, the air temperature and flow rate, the properties of thermal test head 14, and the accuracy of the control technique. Key factors include the offset and transition time, which are the number of degrees of temperature overdrive required to quickly bring DUT 12 to a setpoint temperature and the amount of time required for DUT 12 to change temperature. Several types/sizes of thermal caps 34 may be tried to optimize the integration of the temperature controlled air and DUT 12, and can greatly reduce the offset and transition times.

The average amount of time required by DUT 12 to become stable at temperature before testing can begin is the soak time. The soak time is typically determined and programmed by a user into system 10 before testing begins to assure accuracy and repeatability of test results. Soak time is determined by directly measuring the thermal response of a component. This can be implemented in several ways, depending on the characteristics and requirements of the test item.

Vertical movement of support arm 18 is accomplished by a linear actuator, which is activated by buttons on thermal test head 14. A motor raises or lowers the entire arm using a screw-drive mechanism. A similar mechanism, though smaller in scale, is used for horizontal motion of the arm.

Thermal test head 14 may contain "hot heater" air heater 84, "purge heater" air heater 94 and "cold heater" air heater 72, which is preferably heavily-insulated. A snap-disk thermostat is attached to the case of each heater to protect against possible over-temperature conditions. A diverter valve connected to the output of air heater 72 may be used for a cold air bleed, to provide a continuous flow of cold air to thermal test head 14 during hot operation so that cold air is immediately available when system 10 is switched to cold operation.

Touch screen 28 presents an operating system help that may be used in two ways. A user can access a main help index by touching a HELP button icon on a main menu or access screen-specific help by touching a HELP button located on a particular screen. Touching an underlined item provides access to a screen topic associated with that item. To exit a help screen, a command CLOSE is used within the FILE menu. If a help screen is too long for the entire contents to display on screen 28, a user can scroll down the screen 28 by sliding a control box located on a scroll bar to the right. By selecting STARTUP SYSTEM from the main menu on screen 28, a user initiates an automatic start-up sequence that ensures system 10 is properly started and prepared for use at cold temperatures. It functions to purge refrigeration unit 66 of any excess moisture and allows the heat exchanger 68 to reach a maximum cold temperature. Any manual operating parameters are set up in a manual control icon presented on screen 28, after system 10 warms up. A set up or change of the parameters requires changing and entering data via a numeric keypad. A user may save the setup under a unique file name. The numeric keypad is accessed anytime that a numeric field is touched. To enter a new number into the field, a user presses the digits on the keypad presented on touch screen 28. An alphanumeric keyboard appears anytime that an alphanumeric field is touched. To enter a text/numeric string into a field, a user presses the characters on the keyboard presented on touch screen 28. The characters will display on the keyboard field located at the top of the keyboard. A project source file is a master control file that allows a wide range of operating, configuration and software setup data to be saved under a unique file name. The project source file points to all the set-ups that are currently active when the project name is defined and saved. The specific set-ups that the project file points to are the setups saved under unique file names on a variety of record screens, including the current configuration, manual, graph setup, profile, calibration, and data plot setup files. To create a project, all of the parameters required for a project are defined and saved using various configuration, graphing and profile screens. The project record is accessed via a directory selection on the main menu or from a project ID button on the configuration setup screen.

System 10 operating parameters are set up using the configuration setup screen. A specific setup can be saved as a configuration record and recalled for use as needed. A test profile screen is used to enter data required for an automatic series of tests. To access the screen 28, select PROFILE from the main menu or any other menu on which it appears. When finished entering the sequences, a user can save the setup using the profile record screen. A graph display screen displays the currently activated test sequence in graphical form. The parameters that control the appearance of the screen are set up in a setup graph screen. The temperature setpoint, DUT 12 temperature, and fixture air temperature may be displayed on such graphs.

Control unit 30 has three interfaces. An RS-232C serial interface is a bit-serial interface used for communication between system 10 and computers and peripheral equipment. An IEEE 488.2 parallel bus is a byte serial, bit parallel interface used to transfer digital data among a group of computers, measuring equipment, and other system components. A direct interface for automatic test equipment (ATE) includes two signals, a "Start-Test" signal sent from system 10 to the ATE and an "End-of-Test" signal sent from the ATE to system 10. The connectors for these interfaces are located on a rear panel of console 24.

The EIA standard RS-232C serial interface can be used to remotely operate system 10 using IEEE-488.2 bus commands. It can be used to display the maintenance information and diagnostics on a standard terminal. Data transmission rate, handshake mode, and data parity can be programmed from touch screen 28 via a hardware setup screen. The data format of the characters transmitted or received consists of ten or eleven bits, depending on the transmission rate selected. The RS-232C interface uses two data lines (one for each direction) and two handshake lines. All characters received by system 10 are put into a buffer until they can be interpreted. Handshaking can be used to protect characters from being lost if data is received faster than system 10 can process it, or if system 10 is sending data faster than the computer or terminal can receive it. This handshaking function is programmable. System 10 can communicate directly with an ATE during temperature cycling and soak timer operation. The ATE is connected to system 10 at the rear panel. System 10 can send a "Start-Test" signal directly to the ATE and receive an "End-of-Test" signal from the ATE. The "Start-Test" signal is a relay contact closure that is activated every time the built-in soak timer ends its timing period. The relay contact closes for 10 ms every time the soak timer in system 10 reaches a normal termination of a soak time period. The relay contact is isolated from the electronics of system 10. The maximum ratings of the contacts are 0.25A and 50 V dc. The maximum voltage differential between system 10 and the contacts is 500 V dc. The "End-of-Test" signal input is an optically isolated input that is used during temperature cycling to step to the next temperature set point in the cycle. This signal is activated by sending a current (minimum three mA) through the input lasting at least one ms. The voltage range for the input is 3 V to 15 V. The input circuit comprises a light emitting diode (LED) half of an optical isolator. The maximum current through the input is typically twenty mA and the maximum voltage differential between the input and system 10 (common mode voltage) is 500 V DC.

The IEEE-488.2 bus uses eight data lines and eight control lines to transfer digital data among a group of computers, measuring equipment, and other system components. For the physical specifications of the bus, see IEEE Standard 488-1978, "IEEE Standard Digital Interface for Programmable Instrumentation," published by the Institute of Electrical and Electronic Engineers, Inc. As many as fifteen devices may be connected to the bus at one time. One device is the bus controller. The controller orders the rest of the devices to either send data (talk) on the bus or receive data (listen) on the bus. Each device on the bus has a unique address that the controller uses when administrating the bus. DUT 12 addresses have a range of zero to thirty, with zero being the typical controller address. Two types of data are transferred on the bus, remote control commands and set points from the computer to system 10, and temperature measurement results and status messages from system 10 to the computer. All commands and messages sent on the bus conform to character strings using the ANSI X3.4-1977 ASCII 7-bit code. A IEEE-488.2 bus standard connector is located on the rear panel of console 24.

Calibration procedures include air-flow calibration, manual temperature calibration of fixture and DUT 12 sensors (33 and 38), automatic temperature calibration of DUT sensor 38, and purge air temperature calibration. The calibration process serves to systematically adjust and standardize the air flow rate and temperature measurement of system 10. The sensors that a user may calibrate are the hot and cold air flow rate sensors 84 and 72, respectively, the fixture and purge air temperature sensors 33 and 96, respectively, and DUT temperature sensor 38. A user may calibrate DUT sensor 38 manually or use 1000 ohm RTD in an automatic calibration mode. Temperature calibrations may be stored separately and recalled for later use in specific testing situations by control unit 30 via touch screen 28. Calibration comprises measuring the actual temperature or air flow rate, comparing it to a known standard and entering the new values from the standard. System 10 adjusts the control software to ensure accurate display of temperature or flow values. A series of screens presented on touch screen 28 are used to guide a user through each of the calibration procedures. To access a calibration main menu, the user selects CALIBRATION from the main menu. Periodic air flow rate calibration is needed to ensure proper functioning. The air flow rate is calibrated by connecting a flow rate meter that measures the flow rate in SCFM to an air output nozzle on thermal test head 14. An AIR FLOW RATE icon is chosen from the calibration menu and follow the on-screen 28 instructions. System 10 will force air at a high and low-flow rate in both the hot and cold flow pathways, The temperature control of system 10 is a computer-implemented process that executes within control unit 30. Software for the process may be written in the "C" programming language with critical routines coded in assembler. Exemplary code sequences included herein are presented in "C" language. When the system 10 is given a different size of DUT 12, the control software will self estimate the mass and the time constant of a given device then adjust the control algorithm to give a optimized performance of controlling the temperature of the device.

Temperature sensor 33 produces a ±2.5 volt signal expressing a temperature variable T0. Temperature sensor 38 produces a ±2.5 volt signal expressing a temperature variable T1. A twelve-bit A/D converter with better than a fifty microsecond conversion time and a low pass linear filter with gain of 200 and bandwidth of 300 Hz are used to interface sensors 33 and 38 to control unit 30.

The control software is preferably implemented as a foreground and background operation. The foreground loop includes a system initialization, a setup of the A/D converter interface, a startup of a clock driven interrupt service routine (the temperature control algorithm), and a infinite loop which handles the operator interface. The background task is implemented as an interrupt service routine (ISR) that acquires the T0 and T1 data, calculates the temperature error, passes the error through a digital filter including proportional-plus integral-plus differential compensation, and then outputs the result. The background ISR activates every eight millisecond, by virtue of the clock tick on the interrupt, and suspends the foreground routine. When the ISR returns, the foreground routine will resume its operation.

For convenience of "C" programming, data is symbolically defined in the following way:

```
int G_ctrlFlag = CTPL_OFF;       /* on or off */
int G_dataFlag = DATA_UNDEF;     /* undefined, new or old */
int G_sc_Flag = CTRL_OFF;        /* on or off */
int G_setTemp;                   /* set temperature */
int G_upperLimit;
int G_lowerLimit;
int G_Kp;    /* saved in device file */
int G_Kd;    /* saved in device file */
int G_Ki;    /* saved in device file */
int G_Kq;    /* saved in device file */
float G_delta_temp;  /* saved in device file */
char G_sc_devType[9];  /* Device name for self-cal. */
int G sc_testRange;   /* Temperature range for Self-Cal */
int G_sc_upperLimit;    /* upper limit for self-Cal */
int G_sc_lowerLimit;    /* lower limit (not used */
int G_sc_deltaTime;   /* estimated thermal time constant */
```

The above global variables may be calculated through a self-calibration routine and may be changed by a programmer via a user interface menu on touch screen 28.

Two arrays are defined and contain 1000 AIR_TMP (T0) and DUT_TMP (T1) samples each taken every eight milliseconds beginning when an operator selects the temperature control on function in the user interface menu:

```
int t_buffer0[1000] = {0};
int t_buffer1[1000] = {0};
```

For the foreground routine, three windows are created: a control menu (e.g., the operator interface), a display menu (e.g., the display the system setup information), and ... a series of result windows (e.g., AIR TEMP, DUT_TEMP and delta_time, 1000 time ticks after close loop control is enabled by the user). The foreground routine calls an "init()" subroutine which initializes the ADC, an I/O port, and the eight millisecond clock tick. The foreground routine drops into a subroutine "MainLoop()", which is a infinite loop which handles the users interface, display results, etc. When "GO TO DOS" in the control menu is selected by the user, the MainLoop will call a "dump data" routine, which writes t_buffer0[] and t_buffer1[] into a file called DATA in a current directory). The program terminates and control returns to DOS.

A typical code sequence is as follows:

```
main{
    CreateResultWin ( );    /* results window */
    CreateDispWin ( );      /* display window */
    CreateCtrlMenu ( );     /* menu window */
    init ( );               /* initialize */
    MainLoop ( );
    dump_data ( );
}
```

For the background routine, a process "intime ()" is a terminate and stay resident (TSR) interrupt service routine. This routine may be setup by calling a commercially available TURBO C PLUS library routine.

```
isinstal(TIMER_VEC,intime,isclock_ident,&isrctrl,isstack,
STKSIZE,1)
in the subroutine init ( ).
```

In order to reduce the software overhead, subroutines coded in Intel 80×86 assembly language is preferably used to read the ADC. The rest of the software may be written in "C".

Successful self-calibration depends on the ability of the software to estimate the thermal time constant of DUT 12. Expressed in "C" the procedure to do this is:

```
mass = DUT_delta_temp / SAMPLE_UNIT ;
G_Kp = G_Kp_c /mass ;
G_Kd = G_Kd_c /mass ;
G_Ki = G_Ki_c /mass ;
G_Kq = G_Kq_c /mass ;
DUT_delta_temp = delta_temp / delta_time
where:  delta_temp = T_dut[t1] - T_dut[t0]
            (units: K * degrees C., K = filter gain)
        delta_time = t1 - t0
            (millisecond / ISR update rate)
``` and the value "mass" is used as a scaling factor to calculate variables G_Kp, G_Kd, G_Ki, G_Kq. The value for delta_temp is determined by turning-on heater 84 and letting the temperature of DUT 12 rise from ambient to a setpoint temperature which is above the ambient temperature. Preferable results are achieved when the temperature change is from below 0° C. to about 0° C. However, at 30° C. there is a cold-air to hot-air transition in air supply 26 that may disturb the test results. Self-calibration is therefore typically done with hot-air. When calibrating different devices, the calibration setpoint must be at the same temperature. Otherwise a successful self-calibration may not be achieved. At lower temperatures range, e.g., below 70° C., the temperature change of DUT 12 versus time approximates a linear function. The self-calibration set-point is preferably set to 60° C. Before a self-calibration is performed, the temperature of DUT 12 must be stable at ambient temperature.

The control system parameter constants are typically defined in "C" in the following way:

```
#define SAMPLE_UNIT 0.35
#define G_Kp_c 15.0
#define G_Kd_c 27.0
#define G_Ki_c 70.0
#define G_Kq_c 30.0
```

Boundary temperatures above and below a setpoint temperature are established to form a window. See FIG. 4. When T1 is outside this window so-called lead-lag control compensation is used to control the heaters and refrigeration such that the temperature of DUT 12 heads directly for the target setpoint temperature. Inside the window, a "near setpoint" compensation is used that lowers system gain and embraces the results of a calibration procedure that was performed during setup. This is expressed mathematically as:

$$Q = \begin{cases} 0 & |SP - T1| \geq C \\ Q = k(T0 - T1) & |SP - T1| < C \end{cases}$$

where SP=setpoint and C is a window constant.

Figure 4:
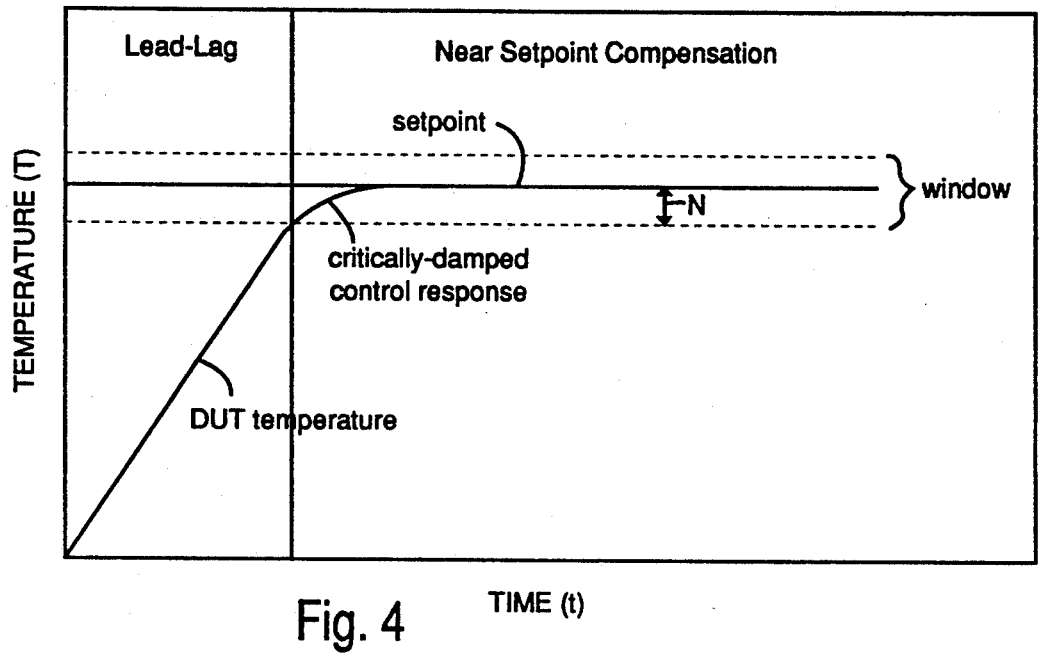
FIG. 4 is a graph plotting the rise in temperature of DUT versus time and showing a lead-lag phase and a near setpoint compensation phase according to whether the DUT temperature is within predetermined window bounds.
Figure 5:
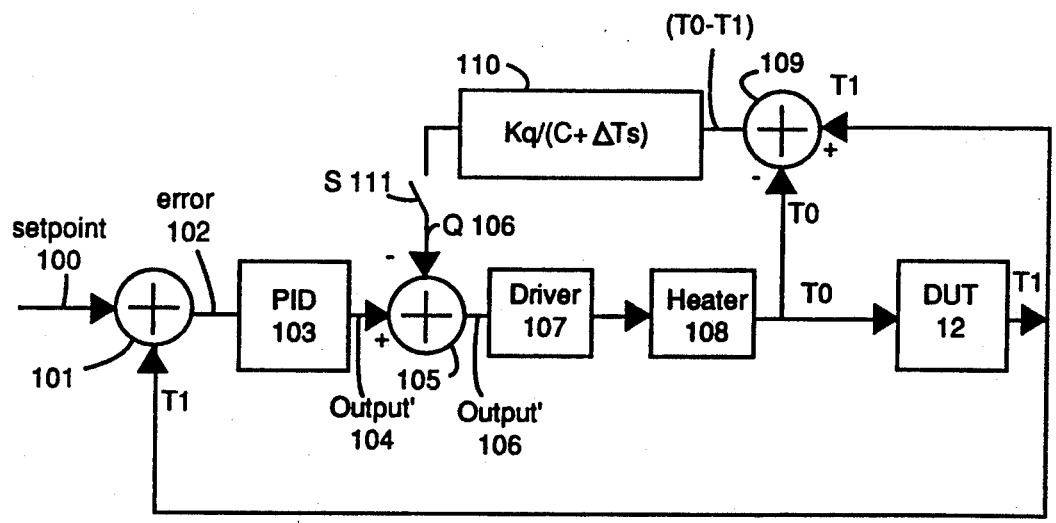
FIG. 5 is a control diagram showing the setpoint, T0 and T1 inputs used to determine lead-lag phase and a near setpoint compensation phase according to whether the DUT temperature is within predetermined window bounds and the application of the result to the error signal.

FIG. 5 illustrates an input setpoint variable 100 coming into a summing junction 101 that produces an error signal 102 that is an input to a proportional-plus integral-plus differential (PID) controller 103. A signal 104 referred to herein as "Output'" is summed in a summing junction 104 with a signal 105 referred to herein as "Q". An "Output" signal 106 controls a heater driver 107, which, in turn, controls a heater 108. Heater 108 represents air system 26 in its simplest form. Temperature controlled air from heater 108 is coupled to DUT 12 and is temperature sampled to produce a measurement "T0". The value of measurement "T0" is applied to a summing junction 109, as well as a temperature sample T1 from DUT 12, to produce difference (T0−T1). Temperature measurement T1 is also returned to summing junction 101. A computation is made in a block 110 that multiplies (T0−T1) by $$\left(\frac{Kq}{C + \Delta Ts}\right)$$

to arrive at a compensation value "Q". A switch (S) 111 will be closed if the absolute value, |T0−T1|, is less than an empirically determined constant "N". In FIG. 4, "N" is the difference in degrees between the setpoint temperature and the window bounds. Sample T1 is also directly applied to summing junction 102. Mathematically, this may be expressed as:

$$\text{Output} = \text{Output}' - \left(\frac{Kq}{C + \Delta Ts}\right) S (T0 - T1)$$

where $$\text{Output} = \text{Output}' + Ki \int \text{error}\, dt + Kd\, \frac{d\, \text{error}}{dt};$$

$$Q = \left(\frac{Kq}{C + \Delta Ts}\right) S\, (T0 - T1);$$

Kp = proportional gain;
Ki = integral gain;
Kd = derivative gain;
Kq = gain;

$$S = \begin{cases} 0 \text{ where, } |T0 - T1| \geq N \\ 1 \text{ where, } |T0 - T1| < N \end{cases}$$

C = constant; and
ΔTs = setpoint - ambient temperature
Lead-lag compensation is done as follows:

---

\* calculate the temperature error
t1_error = G_setTemp − T1;   T1 is DUT temperature
t1_error_last = T1[last_time] − T1 [current]
\* calculate the output signal
output =

$$\frac{G\_Kp \times t1\_error}{4} + \frac{G\_Ki \times t1\_error\_sum}{32} +$$

$$\frac{G\_Kd \times t1\_error\_last}{8}$$

if output > 0 turn-on heater
if output <= 0 turn-off heater.

---

In the output equation, there are three integer divisions. The real number variables G_kp, G_kd, G_ki, G_Kq may not be integer for different devices, but floating point multiply calls to a TURBO C MATH LIBRARY. When G_xx is divided by an integer, the "C" compiler may use an Intel internal assembly function, therefore speeding up the output calculation. This algorithm is used for both cold-air and hot-air. The switching temperature for cold-air to hot-air is approximately thirty degrees Centigrade.

At near ambient temperature control there is a problem that impedes the linear control algorithm from functioning effectively, e.g., when the temperature setpoint is changed from below to above 30° C. and close to ambient temperature. The cause of the problem is that when the set-point is close to the ambient (hot-air is on), the thermal system forward loop gain is highly non-linear. This can be expressed as:

$$\frac{\text{delta\_temp(heater\_on)}}{\text{delta\_time}} >> \frac{\text{delta\_temp(heater\_off)}}{\text{delta\_time}}$$

As a result, there is substantial amount of control over-shoot (underdamping) and the thermal control system takes much longer time to stabilize at any particular setpoint. If the output gain is reduced to compensate for the over-shoot, then control system response becomes very sluggish (overdamped) at other temperatures. Therefore, a special compensation for dynamic critical damping is needed to solve the near ambient temperature control problem, for example:

---

Introducing variables Q, G_Kq, temp_diff,
where  Q = T0 − T1 if t1_error < 5° C. and Q > G_Ki
         Q = 0  otherwise.
adding a new term into the output equation yields:
output' = output − (G_Kq \* Q) / (16 + temp_diff);
where  temp_diff = set_point − 30° C.  (if set_point > 30)
        temp_diff = 128  (if set_point <= 30)

---

The variable temp_diff is used to scale down the effectiveness of this special compensation when the setpoint is further away from the ambient temperature.

Figure 6:
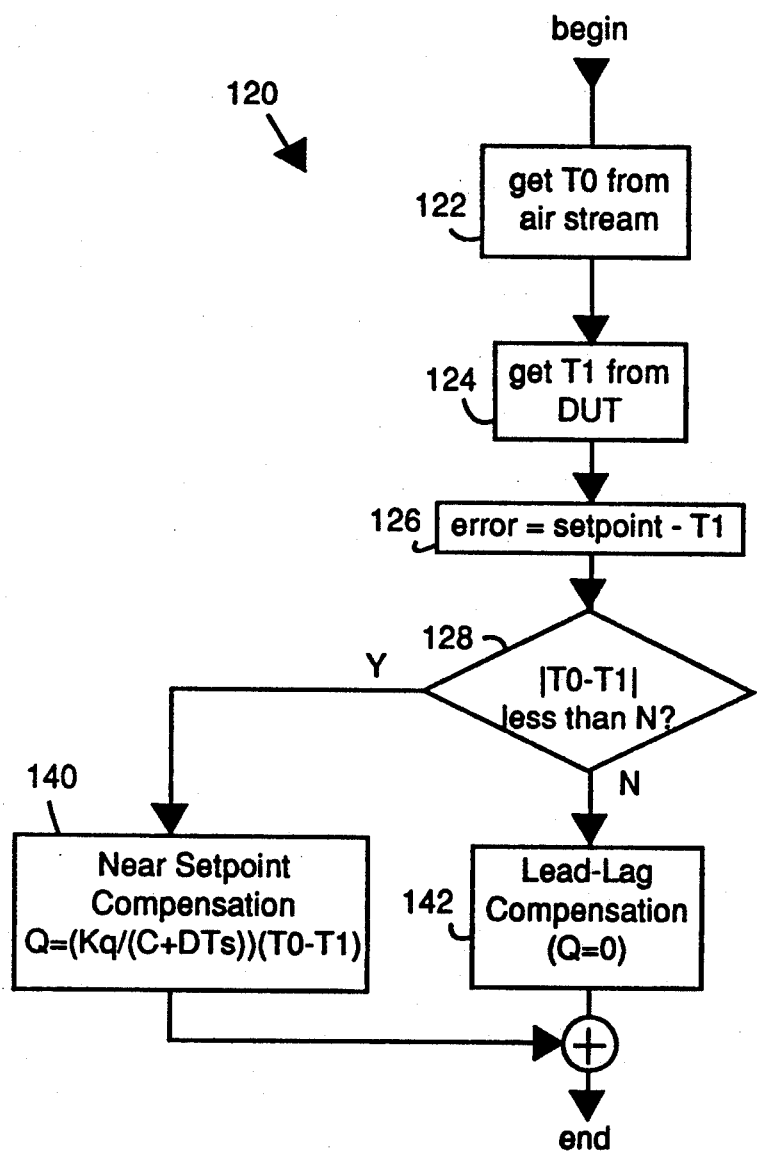
FIG. 6 is a flowchart of the computer-implemented process for the control process diagrammed in FIG. 5.

FIG. 6 illustrates a computer-implemented process 120 that comprises a step 122 that acquires the airstream temperature T0 from sensor 33, a step 124 that acquires the temperature of DUT 12 from sensor 38, a step 126 that computes the error difference between the setpoint and T1, a decision step 128 determines if the error is within the window (e.g., FIG. 4), and if so engages near setpoint compensation in a step 140. Otherwise, a step 142 is provides only lead-lag compensation.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of temperature forcing of a device-under-test (DUT) to a setpoint temperature, the method comprising the steps of:
   measuring the temperature of an air flow directed at the DUT to obtain a value T0;
   measuring the temperature of the DUT to obtain a value T1; and
   compensating a closed-loop temperature control system in control of said DUT with a value Q that is equal to a constant times the difference between T0 and T1 when T1 is within a predetermined temperature window embracing the setpoint temperature.

2. The method of claim 1, further comprising the step of:
   compensating said closed-loop temperature control system with a value Q that is zero when T1 is outside said predetermined temperature window.

3. The method of claim 1, further comprising the steps of:
   sensing when T1 is within a predetermined proximity to the ambient air temperature; and
   reducing the output gain of said temperature control system proportionate to the sum of a constant and the temperature difference between the setpoint and T1.

4. A temperature forcing system, comprising:
   a thermal test head including a shroud for enclosing a device-under-test (DUT) in a temperature controlled environment;
   an air supply system;
   means for coupling temperature forced air from the air supply system through the thermal test head to said DUT;
   first sensing means for measuring the temperature (T0) of said forced air;
   second sensing means for measuring the temperature (T1) of said DUT;

control means for managing the air supply system to raise and lower the temperature of said forced air in a closed loop process including the first and second sensing means to force the temperature of said DUT to a setpoint temperature; and variable compensation means for damping the control means by a factor Q that is equal to a constant (k) times the difference in DUT temperature and the air temperature wherein control convergence on said setpoint temperature by said DUT is critically damped and does not overshoot.

5. The system of claim 4, wherein:
the compensation means operates according to:

$$S = \begin{cases} 0 \text{ where, } |T0 - T1| \geq N \\ 1 \text{ where, } |T0 - T1| < N \end{cases}$$

where N is a window constant that is predetermined in an empirical test of said DUT.

6. The system of claim 4, wherein:
the variable compensation means comprises means to set factor S to zero when temperature T1 is sensed to be outside a predetermined number of degrees of said setpoint temperature.

7. The system of claim 6, wherein:
the variable compensation means comprises means to set factor S as a function of the absolute difference of temperatures T0 and T1 when temperature T1 is sensed to be within said predetermined number of degrees of said setpoint temperature.

8. The system of claim 4, wherein:
the control means comprises means for adjusting the temperature of said DUT according to:

$$\text{output}' = \frac{G\_Kp \times t1\_error}{4} + \frac{G\_Ki \times t1\_error\_sum}{32} + \frac{G\_Kd \times t1\_error\_}{8}$$

when S=0.

9. The system of claim 4, wherein:
the control means comprises means for adjusting the temperature of said DUT according to:

$$\text{output} = \text{output}' - \left(\frac{Kq}{C + \Delta Ts}\right)(T0 - T1)$$

when S=1 and where
ΔTs=setpoint−ambient temperature,
Kq=gain, and
C=constant.

* * * * *